United States Patent
Aulnette et al.

(10) Patent No.: US 7,459,374 B2
(45) Date of Patent: Dec. 2, 2008

(54) METHOD OF MANUFACTURING A SEMICONDUCTOR HETEROSTRUCTURE

(75) Inventors: Cécile Aulnette, Grenoble (FR); Christophe Figuet, Crolles (FR); Nicolas Daval, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 148 days.

(21) Appl. No.: 11/674,392

(22) Filed: Feb. 13, 2007

(65) Prior Publication Data
US 2008/0132031 A1 Jun. 5, 2008

(30) Foreign Application Priority Data
Nov. 30, 2006 (EP) .................. 06291860

(51) Int. Cl.
*H01L 21/00* (2006.01)
*H01L 21/302* (2006.01)
(52) U.S. Cl. ................. 438/455; 438/752; 257/E21.124
(58) Field of Classification Search ............. 438/455, 438/479, 752; 257/E21.088, E21.122, E21.123, 257/E21.124, E21.125
See application file for complete search history.

(56) References Cited

U.S. PATENT DOCUMENTS

| | | | | |
|---|---|---|---|---|
| 5,442,205 | A | 8/1995 | Brasen et al. | 257/191 |
| 7,202,124 | B2 * | 4/2007 | Fitzgerald et al. | 438/200 |
| 7,256,142 | B2 * | 8/2007 | Fitzgerald | 438/763 |
| 2002/0072130 | A1 | 6/2002 | Cheng et al. | 438/10 |
| 2003/0203600 | A1 | 10/2003 | Chu et al. | 438/479 |
| 2003/0215990 | A1 | 11/2003 | Fitzgerald et al. | 438/172 |
| 2004/0075105 | A1 * | 4/2004 | Leitz et al. | 257/190 |
| 2004/0178406 | A1 | 9/2004 | Chu | 257/19 |
| 2005/0179028 | A1 | 8/2005 | Chen et al. | 257/19 |
| 2006/0151787 | A1 | 7/2006 | Chen et al. | 257/65 |

FOREIGN PATENT DOCUMENTS

| | | |
|---|---|---|
| EP | 1 439 570 A1 | 7/2004 |
| EP | 1 447 839 A1 | 8/2004 |
| WO | WO 02/33746 A1 | 4/2002 |

OTHER PUBLICATIONS

M. L. Lee, Minjoo et al., "Strained Si, SiGe, and Ge channels for high-mobility metal-oxide-semiconductor field-effect transistors", Journal of Applied Physics, vol. 97, 011101 (2005).

* cited by examiner

*Primary Examiner*—Scott B. Geyer
*Assistant Examiner*—Seahvosh J Nikmanesh
(74) *Attorney, Agent, or Firm*—Winston & Strawn LLP

(57) ABSTRACT

A method for manufacturing a semiconductor heterostructure by first manufacturing a donor wafer having a first substrate with a first in-plane lattice parameter, a spatially graded buffer layer having a second in-plane lattice parameter, and a strained smoothing layer of a semiconductor material having a third in-plane lattice parameter which has a value between that of the first and second lattice parameters. A top layer is formed on the ungraded layer a top layer of a semiconductor material having a top surface, optionally with a superficial layer present on the top surface and having a thickness that is equal to or smaller than 10 nanometers. Next, a handle wafer of a second substrate having an insulator layer thereon is bonded with the donor wafer in such way that (a) the insulator layer of the handle wafer is bonded directly onto the top surface of the top layer of the donor wafer, or (b) the insulator layer of the handle wafer is bonded onto the superficial layer.

17 Claims, 3 Drawing Sheets

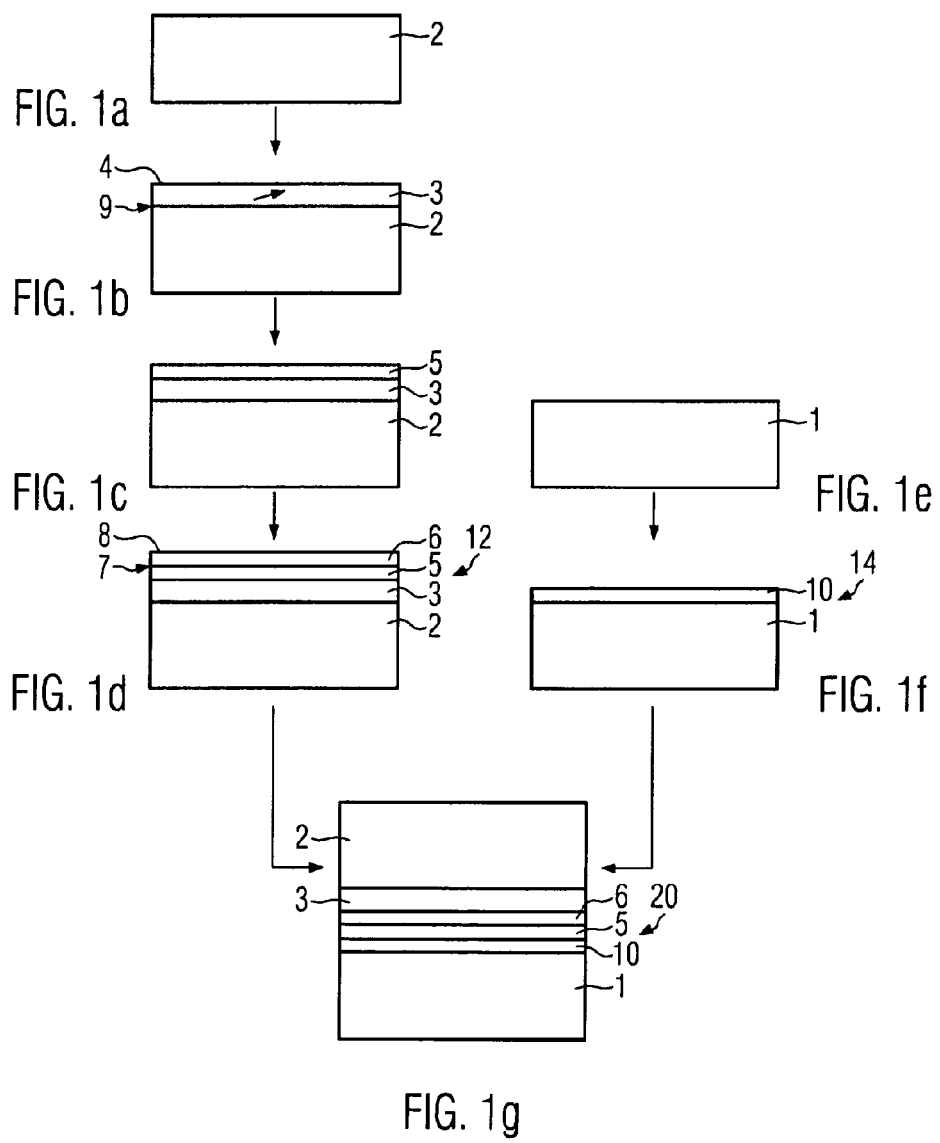

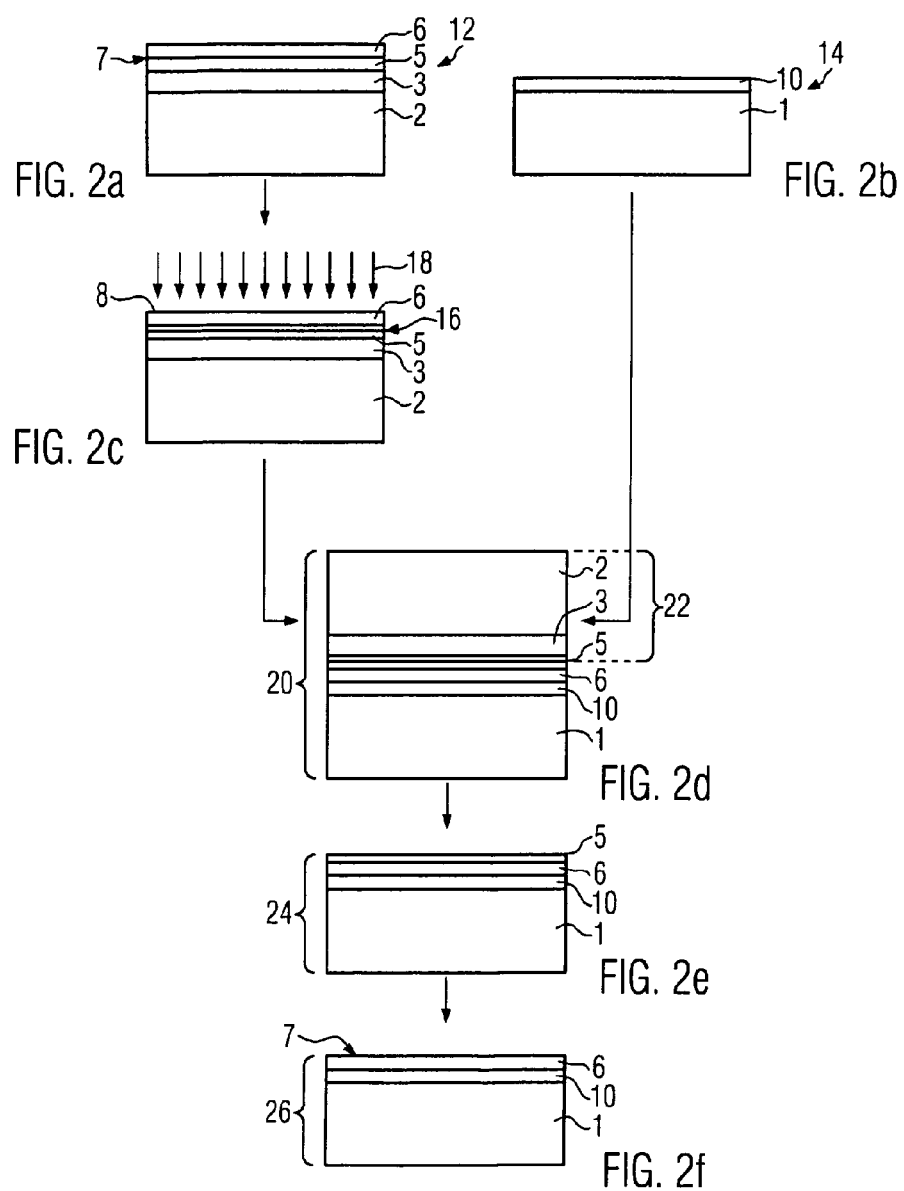

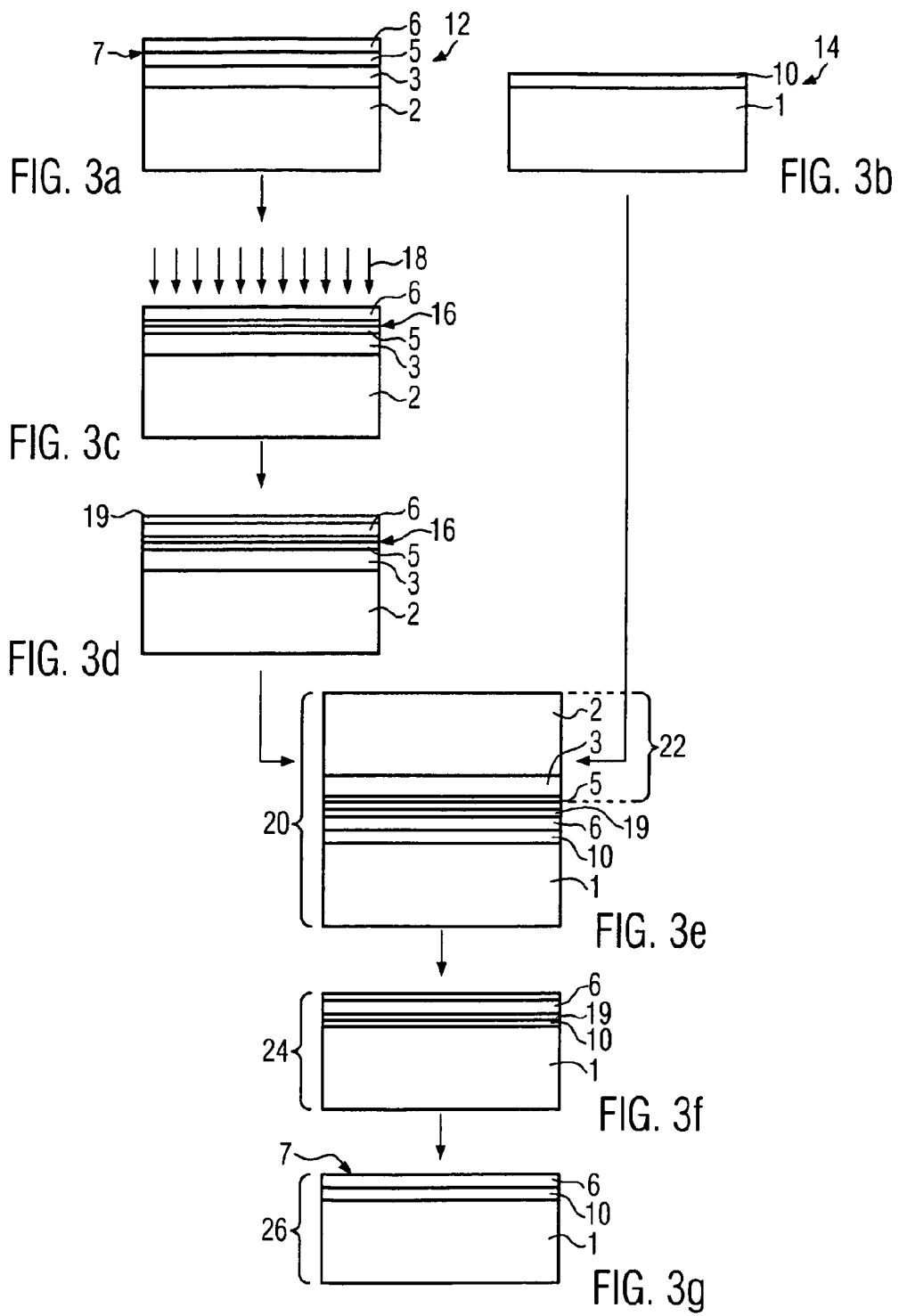

METHOD OF MANUFACTURING A SEMICONDUCTOR HETEROSTRUCTURE

BACKGROUND ART

The invention relates to a method of manufacturing a semiconductor heterostructure, comprising manufacturing a donor wafer, comprising providing a first substrate with a first in-plane lattice parameter, providing on the first substrate an at least spatially graded buffer layer having on top in a relaxed state a second in-plane lattice parameter, forming on the graded buffer layer an ungraded layer of a semiconductor material having in relaxed state a third in-plane lattice parameter, forming on the ungraded layer a top layer of a semiconductor material, and manufacturing a handle wafer, comprising providing a second substrate, forming on the second substrate an insulator layer, and bonding the donor wafer with the handle wafer.

Semiconductor heterostructures like this are used, for instance, to transfer the top layer or the top layer and a part of the ungraded layer by means of splitting of the donor wafer onto the handle wafer.

A principal structure of a donor wafer is known from U.S. Pat. No. 5,442,205 disclosing semiconductor heterostructure devices with strained semiconductor layers. The known heterostructure includes a strained epitaxial layer of silicon or germanium which is located over a silicon substrate with a spatially graded $Ge_xSi_{1-x}$ epitaxial layer, which in turn is overlaid by an ungraded $Ge_{x0}Si_{1-x0}$ layer, intervening between the silicon substrate and the strained layer. Such heterostructures can serve, for instance, as a foundation for surface emitting LEDs or MOSFETs. The spatially graded $Ge_xSi_{1-x}$ layer is used to adapt the lattice parameter between the underlying substrate and the deposited relaxed material, while trying to minimize the density of defects. Usually, the ungraded layer of SiGe with constant Ge concentration corresponding to the concentration obtained at the top of the graded layer is provided as a relaxed layer to improve the crystalline quality of the structure.

The structure obtained usually has a surface morphology that is not suitable for further use, in particular for bonding or growing of further layers thereon. US patent application 2003/0215990, which is preoccupied with preventing interdiffusion of dopants in semiconductor heterostructures, proposes a planarization step, in particular a Chemical Mechanical Polishing (CMP) step, before growing any further layer. Here it is the role of CMP to provide a polished smooth surface, which is typically of about 2 Å. Following CMP, the substrate needs to be further treated to prepare the subsequent layer deposition. Such treatments include treating the surface using a HF solution and furthermore a bake or other treatment to remove oxides. This application also proposes epitaxial deposition of further layers such as silicon germanium or strained silicon layers.

It appears, however, that the resulting surface properties for the semiconductor heterostructures are unsuitable when applying the above described prior art processes. Indeed, due to the bake prior to the deposition of the further layers, a roughening of the silicon germanium surface occurs. During the subsequent growth of, e.g., a strained silicon layer, the surface roughness tends to diminish again the final roughness, but nevertheless stays considerably higher than the roughness of the graded GeSi layer surface or of the capping layer, if present, after the CMP process, as the thickness of the strained silicon layer cannot exceed a critical thickness beyond which defects would nucleate within the layer or at the interface of the strained and the underlying layers. Therefore, the overall thickness of the strained silicon layer is too thin, so that no additional CMP can be carried out for flattening out the surface of the strained silicon layer to the desired values. In addition to the thickness aspect allowing a partial improvement of the surface roughness, US patent application 2003/0215990 also proposes to control the temperature at which the layers are grown after planarization, but still only final surface roughness values of the order of 5 Å are achieved at best.

Although, this procedure leads to a decrease of surface roughness of the strained top layer, it does not influence the roughness of the interface between the strained top layer and the underlying SiGe layer. Since even this interface will be the top surface of the finished sSOI product after layer transfer and removal of the remainder of the split SiGe layer, the resulting sSOI structure will still have an increased surface roughness.

Because of the high surface roughness and overall topology of the top layer of the donor wafer, problems such as non-transferred areas, voids, etc. occur during direct wafer bonding of the donor wafer with a handle wafer whether or not an insulator layer is provided on the handle wafer. These problems are in particular critical if the structure is implanted before bonding to be split after bonding as known from the SMART-CUT® process. Although it is, in general, possible to anneal a bonded structure for a certain time at elevated temperatures to reinforce the bonding strength despite of unfortunate surface properties of the bonded wafers, such a heat treatment at high temperature is not recommended for use in the SMART-CUT® process. Here, it is important to have a very good bond before splitting which is performed at about 400 to 500° C. Therefore, the surface condition of a donor wafer has to be nearly perfect before bonding such that the bond is of high quality even after low temperature bonding at about 200° C. A "nearly perfect" surface not only has to be of low roughness but should also have a very planar surface, i.e., a very homogeneous surface topography.

Furthermore, it has been observed that splitting for layer transfer results in less defects when an insulator is provided on the handle substrate. An explanation for this effect can be that the species implanted in the donor wafer may diffuse toward the bonding interface and that this can be prevented by the existence of an insulator layer on the donor to block this diffusion. To absorb these species before they reach the interface and prevent an efficient bonding thus results in a higher quality splitting.

For bonding of the donor wafer, it was therefore necessary to form on the top layer of the donor wafer an insulator layer, e.g. by means of an oxidation step of the top layer or, more preferably, by deposition of an insulator layer because the top layer is generally too thin to accurately be formed by oxidation. Since the formation of an insulator layer on the donor wafer is connected with a thermal treatment of the donor wafer, the thermal load on the donor wafer could exceed a certain thermal budget of the donor wafer causing, for instance, an unintentional diffusion of germanium inside of the donor wafer leading in turn to diffuse interfaces between the layers of the donor wafer.

As deposition tends to form a rough surface, an additional polishing step may be necessary and as a consequence a uniform thickness of the resulting insulator layer is difficult to achieve. Because of deposition and/or polishing of the insulator, thickness non-uniformities of the formed insulator layer can occur. This thickness variance influences the emissivity of the final substrate which affects the temperature distribution on its surface during further processing such as epitaxial deposition on the SOI substrate to provide thicker strained silicon values or devices manufacturing processes.

Furthermore, the bad uniformity and topography of a donor wafer having an oxide deposited thereon complicates bonding of the donor wafer with a handle wafer.

In view of the above, it is apparent that improvements in surface roughness of such materials are needed.

SUMMARY OF THE INVENTION

The present invention now resolves the problems of the prior art by reducing the thermal load on the donor wafer substrate with the top layer before bonding while still achieving good bonding and splitting results. This result is achieved according to the improved method for manufacturing a semiconductor heterostructure as disclosed herein. In this method, a donor wafer is first made by providing a first substrate with a first in-plane lattice parameter, providing on the first substrate an at least spatially graded buffer layer having on top in a relaxed state a second in-plane lattice parameter, and forming on the graded buffer layer an ungraded layer of a semiconductor material which is a strained smoothing layer of a semiconductor material having in a relaxed state a third in-plane lattice parameter which has a value between that of the first and second lattice parameters. Next, a top layer of a semiconductor material having a top surface can be formed on the ungraded layer, optionally with a superficial layer present on the top surface of the top layer of the donor wafer, wherein, when present, the superficial layer has a thickness that is equal to or smaller than 10 nanometers. A handle wafer is manufactures by providing a second substrate, forming on the second substrate an insulator layer, and bonding the donor wafer with the handle wafer. The handle wafer is bonded with the donor wafer in such a way that (a) the insulator layer of the handle wafer is bonded directly onto the top surface of the top layer of the donor wafer, or (b) the insulator layer of the handle wafer is bonded onto the superficial layer that is present on the top surface of the top layer of the donor wafer.

It is the surprising finding of this invention that a so-called "inverted-bonding" between the donor wafer and the handle wafer can be applied without difficulties by providing the smoothing layer between the graded buffer layer and the top layer, wherein the value of the in-plane lattice parameter of the smoothing layer is chosen such that it is in between the value of the first and second lattice parameter. By means of this arrangement, the surface roughness of the ungraded smoothing layer is reduced compared to the surface roughness of the underlying graded buffer layer. As a consequence, the surface roughness of the donor wafer is reduced in comparison to the state of the art heterostructures and the donor wafer can be bonded directly with the handle wafer without the necessity of depositing an insulator layer on the top layer of the donor wafer before bonding. This is due to the fact that the top layer grows on a strained but smooth surface of the underlying smoothing layer. Due to the omission of a formation of an insulator layer on the donor wafer, the thermal load on this wafer can be reduced and all of the above mentioned disadvantages connected therewith do not apply although the donor wafer can be bonded with the handle wafer especially well.

BRIEF DESCRIPTION OF THE DRAWINGS

Advantageous embodiments of the invention will be described in the following with respect to the figures:

FIGS. 1a to 1g schematically illustrate steps of an exemplary embodiment of the inventive method of manufacturing a semiconductor heterostructure;

FIGS. 2a to 2f schematically illustrate a SMART-CUT® process using the inventive method of manufacturing a semiconductor heterostructure; and FIGS. 3a to 3g schematically show a SMART-CUT® process using another variant of the inventive method of manufacturing a semiconductor heterostructure.

DETAILED DESCRIPTION OF THE PREFERRED EMBODIMENTS

In this context, the term "in-plane lattice parameter" corresponds to a lattice parameter of the various layers in a direction essentially parallel to the interfaces between the various layers and to lattice parameters which the layers would show in an relaxed state. It is, in fact, known that the lattice parameter depends on the material used, but also on the nature of the underlying material on which it is deposited. To be able to compare lattice parameter values of different layers in the following, it is always referred to values as if the layers were in a relaxed state, and not in the strained state under heteroepitaxial conditions, which is also known under the terms pseudomorphic or commensurate growth. As an interface may be characterized by two lattice parameters, the above-mentioned condition can either be satisfied for both lattice parameters or for only one. In addition, the top layer of the heterostructure is not necessarily the final layer, further layers strained or relaxed can be provided thereon.

According to a preferred embodiment, the smoothing layer and/or the top layer can be grown with a growth temperature that is lower than the growth temperature of the buffer layer. It is another surprising observation that, in addition to the intermediate in plane lattice parameter of the smoothing layer, by reducing of the growth temperature for the smoothing and/or the top layer compared to the growth temperature of the buffer layer, the surface roughness of the semiconductor heterostructure is further improved in comparison to what is achieved according to the prior art. Thus by combining the two roughness reducing methods the overall reduction in surface roughness of the donor wafer before bonding can be further enhanced.

Advantageously, the growth temperature is chosen to be about 50° C. to about 500° C. lower than the growth temperature used for forming the buffer layer. The exact choice of the temperature depends e.g. on the precursors used during CVD type deposition of the layers. In this range best results have been achieved for numerous materials.

According to an advantageous embodiment, the thickness of the smoothing layer can be less than the critical thickness, above which defects occur, in particular less than 1000 Å, more in particular a thickness of about 200 Å to 800 Å, even more in particular of about 600 Å. It should be noted that the critical thickness depends on the material choice for the smoothing layer and the underlying layer, but is also a function of deposition temperature. However, for the above mentioned values improved surface roughness values have been obtained. To keep the ungraded layer thin has the advantage of preventing defects on its surface and furthermore is advantageous with respect to production, as throughput can be kept high.

Advantageously, the buffer layer and the smoothing layer can comprise at least two compounds A and B and have a different composition $A_{1-xa2}B_{xa2}$ and $A_{1-xa3}B_{xa3}$ with respect to each other. For example, the buffer layer can be a gradient layer of a binary material, such that starting from the substrate the lattice parameter increases (or diminishes) towards the interface with the top layer and for the smoothing layer the composition of the binary material can be chosen such that a step back (or increase) in lattice parameter is observed. In fact, by changing the composition usually the lattice parameters change in turn. By using the same compounds, the buffer layer and the smoothing layer can be grown under similar process conditions and only the supply of the compounds needs to be adapted to realize the different compositions and thus different lattice parameters.

Preferably the difference in composition $\Delta x = x_{a2} - x_{x3}$ is approximately 0.5% to 8%, in particular 2% to 5%, more in particular 2.5%. For those changes in composition, optimized surface roughness values have been achieved for the surface of the top layer. For $\Delta x$ less than 0.5% the desired flattening effect is not sufficient and for $\Delta x$ larger than 8% the maximum thickness of the smoothing layer would be limited to much due to a reduced critical thickness.

Preferably the top layer can be a strained layer of a relaxed layer, in particular one out of strained silicon (sSi), silicon germanium ($Si_{1-x}Ge_x$), germanium (Ge) and gallium arsenide (GaAs). These materials are playing an important role in modern electronics and therefore with improved semiconductor heterostructures of these materials optimized electronic properties can be achieved. Advantageously the substrate can be of silicon and/or the buffer layer can be of silicon germanium ($Si_{1-xa2}Ge_{xa2}$). Silicon as a standard material is readily available and allows to keep fabrication costs low and furthermore with respect to silicon germanium the buffer layer deposition process is well established so that high quality graded layers or layers with a stepped composition can be achieved by playing with the supply of the silicon and germanium precursors respectively.

According to a preferred embodiment, the smoothing layer can be of silicon germanium ($Si_{1-xa3}Ge_{xa3}$). Thus to grow the smoothing layer one only has to adapt the process already used for the buffer layer to grow the desired layer.

According to another favorable embodiment, starting from a Si substrate, the lattice parameter of the graded buffer layer increases. The resulting surface roughness after CMP and bake of the buffer layer can be attributed to a surface topology having peaks and valleys, wherein the lattice parameter of the crystalline material tends to be larger on the peak, compared to the nominal lattice parameter, and tends to be smaller in the valleys. By now growing the smoothing layer with a smaller nominal lattice parameter, the growth speed of the layer in the valleys shall be higher than for the peaks, as a better match of lattice parameters is observed. Thereby leading to the desired surface flattening effect.

Preferably the growth temperature of silicon germanium when used for the top layer and/or the smoothing layer can be chosen as in Table 1.

TABLE 1

| layer material | growth temperature [° C.] |
|---|---|
| $Si_{1-x}Ge_x$, $x \in [0, 20]$ | 650-750 |
| $Si_{1-x}Ge_x$, $x \in [20, 40]$ | 600-700 |
| $Si_{1-x}Ge_x$, $x \in [40, 60]$ | 550-650 |
| $Si_{1-x}Ge_x$, $x \in [60, 80]$ | 500-600 |
| $Si_{1-x}Ge_x$, $x \in [80, 90]$ | <600 |
| $Si_{1-x}Ge_x$, $x \in [90, 100]$ | <550 |

For this specific material choice, improved surface roughness values have been observed. Advantageously the growth temperature of strained silicon germanium when used for the top layer can be chosen to be less than 600° C., in particular less than 550° C. to 700° C., or wherein the growth temperature of germanium when used for the top layer is chosen to be less than 500° C. For this specific material choice, improved surface roughness values of the top layer of the donor wafer have been observed.

Preferably, the precursor for the smoothing layer can be selected such that it does not incorporate a halide element. For GeSi, for instance germanium, silane or disilane precursors can be used. The presence of a halide in the precursor bears the risk to reveal crystalline defects, which can be present in a GeSi material, e.g. due to preferential etching at the location of a crystalline defect, leading to an increase of the size of the defect and to a deterioration of the quality of the GeSi layer.

The following embodiments will be described using a silicon substrate, a silicon germanium buffer layer and a strained silicon layer. This does, however, not represent a limitation of the invention to those materials. Indeed, the invention can also be applied to other suitable materials, like strained SiGe, SiGeC, Ge or GaAs.

FIGS. 1a to 1g show steps of an exemplary embodiment of the inventive method of manufacturing a semiconductor heterostructure.

In FIG. 1a, a silicon substrate 2 with a first in-plane lattice parameter $a_1$ is provided. Silicon substrates are readily available with different sizes and different crystalline surfaces.

With reference to FIG. 1b, an at least spatially graded buffer layer 3 of $Si_{1-x}Ge_x$ is grown, preferably epitaxially, on the silicon substrate 2. In the shown example, the buffer layer 3 consists of the two compounds: silicon and germanium the concentration of which changes over the thickness of the buffer layer 3. By doing so, the lattice parameter in the graded buffer slowly changes. For example, one can start with x=0 at the interface 9 towards the silicon substrate 2, so that the lattice parameter corresponds to the one of the underlying silicon substrate 2. Then the germanium concentration can grow until approximately 20%, thereby the in-plane lattice parameter becomes larger. It should be noted, however, that the final germanium concentration can be freely chosen, for instance 30% or 40%, and could even reach 100%.

The growth of the buffer layer 3 can be achieved using state of the art techniques, for example chemical vapor deposition in an epitaxial equipment using standard process conditions. Suitable precursor gases for the deposition of silicon germanium include, for example, $SiH_4$, $Si_3H_8$, $Si_2H_6$, DCS or TCS and $GeH_4$, $GeH_3Cl$, $GeH_2Cl_2$, $GeHCl_3$ or $GeCl_4$ together with $H_2$ as a carrier gas. Depending on the precursor gases and their decomposition temperature the deposition temperature is chosen, as can be seen from Table 2, which represents some possible examples suitable for the growth of $Si_{1-xa2}Ge_{xa2}$ with a germanium content of up to about 20%. The composition gradient is achieved by adapting the amount of the Si and/or Ge precursor. Alternatively the deposition could be carried out by molecular beam epitaxy.

TABLE 2

| Si precursor | Ge precursor | deposition temperature |
|---|---|---|
| $SiH_4$ | $GeH_4$ | 800° C.-900° C. |
| $SiH_2Cl_2$ | $GeH_4$ | 800° C.-950° C. |
| $SiH_2Cl_2$ | $GeCl_4$ | 1000° C.-1100° C. |
| $SiHCl_3$ | $GeCl_4$ | 1050° C.-1150° C. |

In a subsequent step, which is not explicitly illustrated in FIG. 1, a surface treatment is carried out which comprises chemical mechanical polishing (CMP) to obtain a surface on the graded $Si_{1-xa2}Ge_{xa2}$ buffer layer 3 having a roughness of about 1.3 Å RMS, obtained for a scan window of 2 μm*2 μm. Then the achieved structure undergoes a bake step, e.g. is emerged in hydrofluoric acid HF and heated in hydrogen $H_2$ for about three minutes in a temperature range of about 800 to 850° C. This step is used to remove oxide from the surface 4 of the buffer layer 3, but the bake step leads to an increased surface roughness of about 2.6 Å RMS.

Following the surface treatment, in the step shown in FIG. 1c, an ungraded smoothing layer 5 is grown on the buffer layer 3. This smoothing layer 5 is grown with a constant composition of the same compounds silicon and germanium, but with a composition $Si_{1-xa3}Ge_{xa3}$ different to the composition of the final layer on top of the buffer layer 2. Having the same compounds, essentially the same growth conditions can be chosen, except for the amount of precursor gas provided for each compound. The total thickness of the smoothing layer 5 and all further layers that are not lattice matched with the buffer layer 3 should be less than a critical thickness, to prevent the nucleation of dislocations or other defects which would occur above this thickness. The value of the critical thickness depends on the difference in Ge concentration between the buffer layer 3 and the smoothing layer 5, and also depends on deposition temperature. Best results have been achieved for thicknesses of less than 1000 Å, in particular for a thickness in a range of about 200 Å to 600 Å, more in particular of about 600 Å for the smoothing layer 5. The composition of the smoothing layer 5 is chosen such that the in-plane lattice parameter $a_3$ of that layer 5 is smaller than the in-plane lattice parameter $a_2$ of the final layer of the buffer layer 3. With the germanium composition of 20% on top of the buffer layer 3, in this example, suitable percentages for the smoothing layer 5 are of 12 to 19.5%, in particular 17.5% of germanium. For 40% Ge in the buffer layer 3, Ge concentration in the smoothing layer 5 is between 35% and 39.5%.

According to the step shown in FIG. 1d, a top layer 6 of strained silicon (sSi) is epitaxially deposited on the smoothing layer 5 using state of the art layer deposition methods, resulting in a donor wafer structure 12.

The donor wafer 12 according to this embodiment thus comprises the silicon substrate 2 with a first in-plane lattice parameter $a_1$, the graded $Si_{1-xa2}Ge_{xa2}$ buffer layer 3 having a germanium percentage of 0% at the interface 9 with the substrate 2 and having a germanium percentage of about 20% at its upper surface 4. Within the buffer layer 3 the in plane lattice parameter $a_2$ increases as the amount of Ge increases. The graded buffer layer 3 is essentially relaxed. On the graded buffer layer 3 the ungraded, epitaxial $Si_{1-xa3}Ge_{xa3}$ layer 5 is provided, which as described above has been formed after CMPing and baking the buffer layer 3. The ungraded smoothing layer 5 has a germanium percentage which is in a range of about 12 to 19.5%, in particular 17.5%. So that its nominal, thus relaxed, in-plane lattice parameter $a_3$ is less than $a_2$ on top of the buffer layer 3. However, as the thickness is less than the critical thickness the smoothing layer 5 is strained meaning that its in-plane lattice parameter is larger than the nominal value. Finally on top of the smoothing layer 5 the strained silicon layer 6 as top layer is present.

For a strained silicon layer 6 with a thickness of about 200 Å, surface roughness values of less than 1.8 Å RMS, in particular less than 1.3 Å RMS, have been achieved with a post-bake roughness of the buffer layer 3 being of the order of about 2.6 Å RMS. Up to now, with the state of the art processes, only surface roughnesses exceeding 1.8 Å RMS have been observed.

It should be noted that already the buried interface 7 between the smoothing layer 5 and the strained silicon layer 6 has already a roughness of less than 2.5 Å RMS, in particular less than 2.0 Å RMS, even more in particular of less than 1.8 Å RMS. The buried interface roughness is thus improved with respect to interface 4 having a roughness of the order of 2.6 Å after CMP and bake.

The exemplary embodiment of the invention explained above includes a graded buffer layer 3. However, it is also possible to provide a buffer layer having a different composition structure. For example, a capping layer could be provided on the graded layer 3 prior to CMP and bake, or the buffer layer could comprise a stack of bi-layers, in particular three to five bi-layers, wherein one bi-layer has a graded composition and the second bi-layer a constant composition. A buffer layer being composed of a plurality of layers with constant germanium composition but with a growing composition from layer to layer represents a further alternative. In addition, it is also possible to provide one or more further ungraded layers, also called capping or relaxed layers, in between the ungraded smoothing layer 5 and the top layer 6. For example, another SiGe layer may be deposited onto the smoothing layer 5 with a different SiGe composition.

Instead of a silicon germanium buffer layer 3, other compound materials may be used to slowly increase the lattice parameter starting from the silicon substrate 2 towards the desired value.

According to a further variant, a germanium, a Ge, $Si_{1-y}Ge_y$ or an SiGeC layer may be grown as a top layer, instead of the strained silicon layer 6.

According to another embodiment of the inventive method of manufacturing a semiconductor heterostructure, during the growth of the ungraded smoothing layer 5 a growth temperature is used which is lower than the growth temperature used during formation of the buffer layer 3. The growth temperature for the ungraded $Si_{1-x}Ge_x$ layer 5 is chosen to be about 50° C. to about 500° C. lower than the growth temperature of the graded buffer layer 3. During growth of the buffer lower 3 one typically looks for a high deposition temperature to ensure high growth rates but by choosing a lower growth temperature for the ungraded layer 5, even though growth speed will lower, it is possible to preferably deposit material in the valleys of the surface of the $Si_{1-x}Ge_x$ buffer layer 3 rather than on the peak. As a consequence a smoothing effect occurs. This effect adds to the already advantageous effect of having a smaller in-plane lattice parameter applied in the first embodiment. Thus, a further improved smoothing of the surface 7 of the ungraded layer 5 and thus also of the top layer 6, here the strained silicon layer, will occur.

Indeed, when the growth temperature is high, the total thermal energy of the arriving atoms is high and the surface energy, which is the energy of the surface on which the atoms are deposited, becomes negligible, so that it cannot have a positive impact on smoothening. If, however, the thermal energy is relatively low, like here, the surface energy can have a positive impact, as by depositing atoms into the valleys, the overall surface becomes smaller and an energy gain is observed. Thus, in this case a smoothing of the surface will occur. If, however, the temperature is too low, the thermal energy will not be sufficient for the arriving atoms to move to the preferred nucleation sites in the valleys to reduce the surface energy.

By using this variant of the invention, the surface roughness properties are even better both at the buried interface 7 and on the surface of the top layer 6. For a strained silicon layer 6 with a thickness of about 200 Å, surface roughness values of less than 1.15 Å RMS has been achieved with a post-bake roughness of the buffer layer 3 being of the order of about 2.6 Å RMS. Also the buried interface 7 between the ungraded layer 5 and the strained silicon layer 6 has improved roughness values of less than 1.8 Å RMS, and as low as 1 Å RMS.

The advantageous temperature range actually used depends on the material of the layer, e.g. for a $Si_{1-x}Ge_x$ layer on the germanium content, the precursor gases used, and the layer thickness. Table 3 illustrates the preferred temperature range for the smoothing layer 5 as a function of the germanium percentage in $Si_{1-x}Ge_x$.

TABLE 3

| layer material | typical growth temperature buffer layer 3 [° C.] | growth temperature ungraded layer 5 [° C.] |
| --- | --- | --- |
| $Si_{1-x}Ge_x$, x∈[0, 20] | 800-900 | 650-750 |
| $Si_{1-x}Ge_x$, x∈[20, 40] | 750-850 | 600-700 |
| $Si_{1-x}Ge_x$, x∈[40, 60] | 700-800 | 550-650 |
| $Si_{1-x}Ge_x$, x∈[60, 80] | 650-750 | 500-600 |
| $Si_{1-x}Ge_x$, x∈[80, 90] | 600-700 | <600 |
| $Si_{1-x}Ge_x$, x∈[90, 100] | 550-650 | <550 |

For CVD layer deposition of the smoothing layer 5 the precursors have to be chosen such that they have a decomposition temperature which is lower or at least close to the temperature range indicated in Table 3. As a consequence, it may occur that for the growth of the smoothing layer 5 a different precursor is used or needs to be used than for the buffer layer 3.

FIG. 1e shows the step of providing a handle substrate 1 consisting of silicon or another material suitable to act as a carrier material for a resulting heterostructure.

With reference to FIG. 1f, an insulator layer 10 is formed on the handle substrate 1 forming a handle substrate 14. The insulator layer 10 can be a native or grown insulator and is in the shown example of $SiO_2$ formed by an oxidation of the handle substrate 1.

FIG. 1g shows a bonding step in which the handle wafer 14 is bonded with the side of the insulator layer 10 directly onto the free surface 8 of the top layer 6 of the handle wafer 12 resulting in a source-handle-compound 20.

Although on the top layer 6 of the donor wafer 12 no insulator layer is formed, bonding can be performed very well. Due to the absence of an extra formed insulator layer on the donor wafer 12 and because of the influence of the smoothing layer 5 it is not only possible to provide a very low roughness but also a good topology of the surface 8 of the donor wafer 12 so that the surface 8 is well suited for bonding. This way, inverted bonding can be applied to bond the donor wafer with the handle wafer according to which it is only necessary to provide the handle wafer with an insulating layer. The donor wafer needs not be subjected to a thermal treatment for a formation of an insulator layer for bonding leading to the fact that relatively sharp interfaces between the layers of the donor wafer can be maintained and the difficulties in formation of a homogeneous insulating layer on the donor wafer do not occur.

FIGS. 2a to 2f schematically illustrate a further embodiment according to the invention, namely a SMART-CUT® fabrication process using the inventive method to fabricate a strained layer on insulator wafer, here a strained silicon on insulator wafer (sSOI).

FIG. 2a shows the donor wafer 12 comprising the substrate 2, the graded buffer layer 3, the ungraded smoothing layer 5 and the strained silicon layer 6 which have been fabricated as described above.

FIG. 2b shows a handle wafer 14. On a handle substrate 1 which is typically a standard wafer, e.g. a silicon wafer, an insulating layer 10 is provided. This layer 10 can be a deposited layer or can be formed by thermal oxidation of the handle substrate 1, resulting e.g. in a $SiO_2$ layer in the case of a Si wafer. The insulating layer 10 is preferably formed by oxidation of a Si handle substrate 1, because this permits to obtain an oxide layer being very uniform, smooth, and resistant to a chemical attack which my follow in a subsequent processing step after the splitting step.

FIG. 2c illustrates the process to create a predetermined splitting area 16 in the donor wafer 12. This is achieved by implanting atomic species 18, like for example hydrogen ions or other inert gases, with a predetermined dose and energy. Due to the implantation the predetermined splitting area 16 is created inside the donor wafer 12. The implantation conditions are chosen such that the predetermined splitting area 16 is positioned below the strained layer 6.

FIG. 2d illustrates the next step in the process which consists in attaching the donor wafer 12 to the handle wafer 14 by bonding the free surface of the insulating layer 10 of the handle wafer 14 directly onto the free surface of the top layer 6 of the donor wafer 12 to thereby form a donor-handle compound 20. Prior to bonding, eventually a surface preparation step is carried out. Although there is no smoothing insulator layer on the top of the top layer 6, bonding between the donor wafer 12 and the handle wafer 14 leads to very good bonding results.

The donor-handle compound 20 is then placed into a furnace (not shown) and heated such that the predetermined splitting area 16 is fragilized or weakened which finally leads to a detachment of the remainder 22 of the donor wafer 12. Instead of providing thermal energy, the fragilization and detachment may also be achieved by providing additional energy in any form, for instance mechanical energy or a combination of thermal and mechanical energy.

FIG. 2e illustrates the result of the detachment step. A compound material wafer 24 is achieved comprising the insulating layer 10, the top layer 6 and a part of the ungraded layer 5 in this order on the handle substrate 1.

The compound material wafer 24 then undergoes a further surface treatment to remove the remaining part of the smoothing layer 5. This can, for example, be achieved by an etching step. As a consequence, the former buried interface 7 now becomes the free surface.

A final strained silicon on insulator substrate 26 is illustrated in FIG. 2f. It comprises the handle substrate 1, the insulating layer 10 and the top layer 6, thus the strained silicon layer. As due to the provision of the smoothing layer 5 the buried interface 7, now being the free surface, has superior surface roughness properties, the strained silicon wafer according to this embodiment is improved compared to the prior art. Instead of a strained silicon on insulator wafer also other types of top layers 6 could be transferred including the above mentioned SiGe, Ge or GaAs.

In addition, the thickness of the strained silicon layer could be increased by epitaxial deposition of silicon, for instance up to 600 or up to 800 Å.

Besides the above described sSOI wafers, SiGe on insulator (SiGeOI) wafers can be produced with the inventive method, for instance by using SiGe as top layer 6 or by depositing a relaxed layer of SiGe on the top layer 6, wherein this SiGe layer is lattice matched with the buffer layer 3.

FIGS. 3a to 3g schematically show a SMART-CUT® process using another variant of the inventive method of manufacturing a semiconductor heterostructure.

The step shown in FIGS. 3a to 3c and 3e to 3g correspond in general to the steps shown in FIGS. 2a to 2f. Therefore, regarding these steps, reference is made to the description of FIGS. 2a to 2f above.

With reference to FIG. 3d, a thin superficial layer 19 is present on the top layer 6 of the donor wafer 12. In the example shown in FIG. 3d, the superficial layer 19 is a native oxide layer having a thickness being equal or lower than 10 nanometres. In other examples of the invention, the superficial layer 19 can be formed as a result of a surface preparation step performed on the donor wafer 12. Such a surface preparation step can include a cleaning step and/or a plasma activation step leading to the formation of a very thin superficial oxide layer 19 on the top layer 6 of the donor wafer 12. The superficial layer 19 is, because of its very low thickness of ≦10 nm, not comparable with an oxide or insulator layer formed or deposited intentionally as an extra laxer on the top layer 6.

As shown in FIG. 3e, the handle wafer 14 is bonded with its insulator layer 10 onto the superficial layer 19 on the top layer 6 of the donor wafer 12. Despite of the absence of an insulator layer being thick enough to have a smoothing influence on the bonding surface of the donor wafer 12, bonding between the handle wafer 14 and the donor wafer 12 leads to a very good bonded donor-handle compound 20.

The heterostructures manufactured with the inventive method are advantageously used in semiconductor devices, as improved electrical or optical properties can be achieved with the substrates having improved surface roughness properties.

What is claimed is:

1. A method for manufacturing a semiconductor heterostructure, which comprises:
   manufacturing a donor wafer by providing a first substrate with a first in-plane lattice parameter, providing on the first substrate an at least spatially graded buffer layer having on top in a relaxed state a second in-plane lattice parameter, and forming on the graded buffer layer an ungraded layer of a semiconductor material which is a strained smoothing layer of a semiconductor material having in a relaxed state a third in-plane lattice parameter which has a value between that of the first and second lattice parameters,
   forming on the ungraded layer a top layer of a semiconductor material having a top surface, optionally with a superficial layer present on the top surface of the top layer of the donor wafer, wherein, when present, the superficial layer has a thickness that is equal to or smaller than 10 nanometers, and
   manufacturing a handle wafer by providing a second substrate, forming on the second substrate an insulator layer, and bonding the donor wafer with the handle wafer;
   wherein the handle wafer is bonded with the donor wafer in such way that (a) the insulator layer of the handle wafer is bonded directly onto the top surface of the top layer of the donor wafer, or (b) the insulator layer of the handle wafer is bonded onto the superficial layer that is present on the top surface of the top layer of the donor wafer.

2. The method of claim 1, wherein at least one of the smoothing layer or the top layer is grown with a growth temperature that is lower than that of the buffer layer.

3. The method of claim 2, wherein at least one of the smoothing layer or the top layer has a growth rate that is about 50° C. to about 500° C. lower than the growth temperature of the buffer layer.

4. The method of claim 1, wherein the smoothing layer has a thickness that is less than a critical thickness above which defects occur.

5. The method of claim 4, wherein the critical thickness of the smoothing layer is less than 1000 Å.

6. The method of claim 4, wherein the critical thickness of the smoothing layer is 200 Å to 800 Å.

7. The method of claim 1, wherein the graded buffer layer and the smoothing layer include at least two compounds A and B and also have a different composition $A_{1-xa2}B_{xa2}$ and $A_{1-xa3}B_{xa3}$ with respect to each other.

8. The method of claim 7, wherein the difference in composition $\Delta x = x_{a2} - x_{a3}$ is approximately 0.5% to 8%.

9. The method of claim 7, wherein the difference in composition $\Delta x = x_{a2} - x_{a3}$ is approximately 2% to 5%.

10. The method of claim 1, wherein the top layer is a strained layer or a relaxed layer.

11. The method of claim 10, wherein the top layer is made of silicon (sSi), silicon germanium ($Si_{1-x}Ge_x$) or germanium (Ge).

12. The method of claim 10, wherein either the top layer or the smoothing layer, or both, are silicon germanium ($Si_{1-x}Ge_x$) and a particular growth temperature for the layer is selected according to germanium percentage as:

| layer material | growth temperature [° C.] |
| --- | --- |
| $Si_{1-x}Ge_x$, $x \in [0, 20]$ | 650-750 |
| $Si_{1-x}Ge_x$, $x \in [20, 40]$ | 600-700 |
| $Si_{1-x}Ge_x$, $x \in [40, 60]$ | 550-650 |
| $Si_{1-x}Ge_x$, $x \in [60, 80]$ | 500-600 |
| $Si_{1-x}Ge_x$, $x \in [80, 90]$ | <600 |
| $Si_{1-x}Ge_x$, $x \in [90, 100]$ | <550 |

13. The method of claim 10, wherein the growth temperature of silicon when used for the top layer is chosen to be less than 600° C.

14. The method of claim 10, wherein the growth temperature of germanium when used as the top layer is chosen to be less than 500° C.

15. The method of claim 1, wherein the substrate is made of silicon.

16. The method of claim 1, wherein the graded buffer layer is made of silicon germanium ($Si_{1-xa2}Ge_{xa2}$).

17. The method of claim 1, wherein the smoothing layer is made of silicon germanium ($Si_{1-xa3}Ge_{xa3}$).

* * * * *